United States Patent [19]

Kässer

[11] Patent Number: 4,543,532
[45] Date of Patent: Sep. 24, 1985

[54] DIGITAL FM DEMODULATOR

[75] Inventor: Jürgen Kässer, Diekholzen, Fed. Rep. of Germany

[73] Assignee: Blaupunkt-Werke GmbH, Hildesheim, Fed. Rep. of Germany

[21] Appl. No.: 481,365

[22] Filed: Apr. 1, 1983

[30] Foreign Application Priority Data

Apr. 1, 1982 [DE] Fed. Rep. of Germany ....... 3212054

[51] Int. Cl.⁴ .............................................. H03D 3/00
[52] U.S. Cl. .................... 329/110; 329/107; 375/82
[58] Field of Search ............... 329/104, 107, 110, 122, 329/126; 375/82, 94

[56] References Cited

U.S. PATENT DOCUMENTS 3,803,501  4/1974  Jones, Jr. ............................ 329/104
4,455,533  6/1984  Moraillon ........................... 329/126

FOREIGN PATENT DOCUMENTS 0029376  6/1981  European Pat. Off. .
0046213  2/1982  European Pat. Off. .
3030853  3/1982  Fed. Rep. of Germany .
3145919  5/1983  Fed. Rep. of Germany ...... 329/110

Primary Examiner—Eugene R. LaRoche
Assistant Examiner—Robert J. Pascal
Attorney, Agent, or Firm—Frishauf, Holtz, Goodman & Woodward

[57] ABSTRACT

Intermediate frequency FM signals are converted to digital form and the digital words of successive samples are clocked into a three place shift register. The sum of the values in the first and third stages of the register is divided by the value in the middle stage and the quotient values are then averaged by groups or as a moving average to provide the demodulated signal. Errors in the operation of the divider circuit can be avoided by detecting null values of the content of the middle cell of the shift register to suppress erroneous quotients, or else the values from which the quotients are formed are both squared before dividing. In the latter case the dc component can be eliminated from the output by subtracting a constant.

18 Claims, 4 Drawing Figures

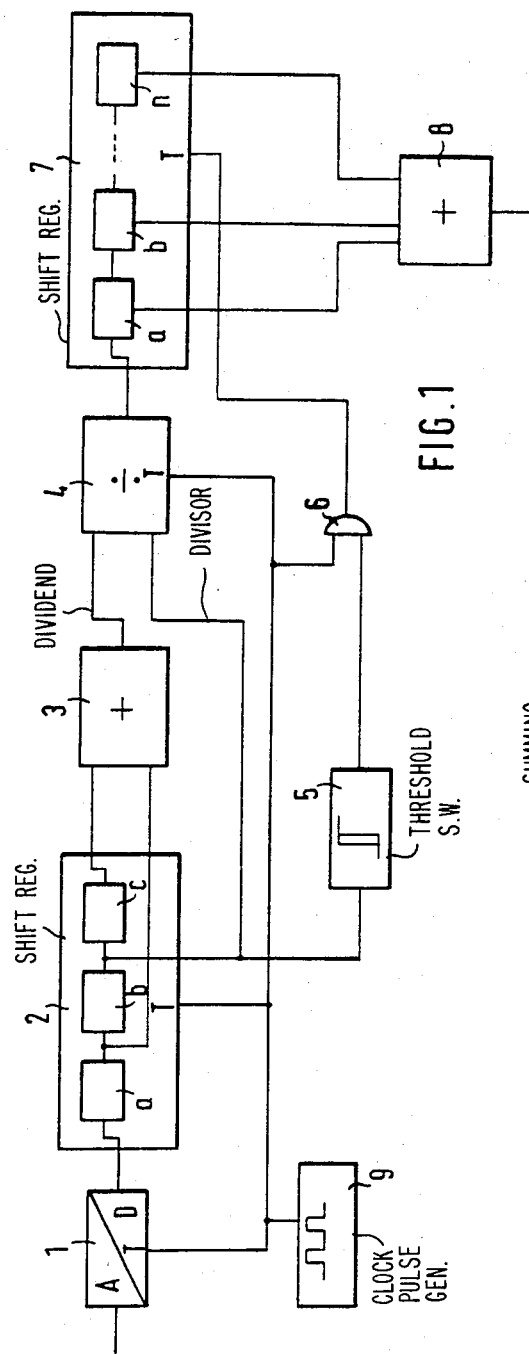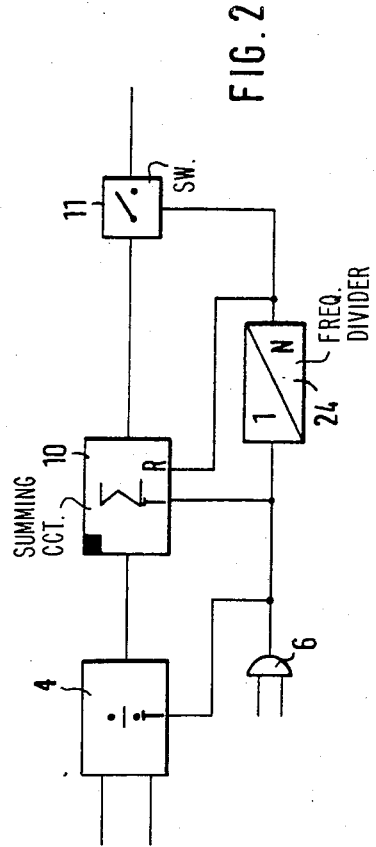

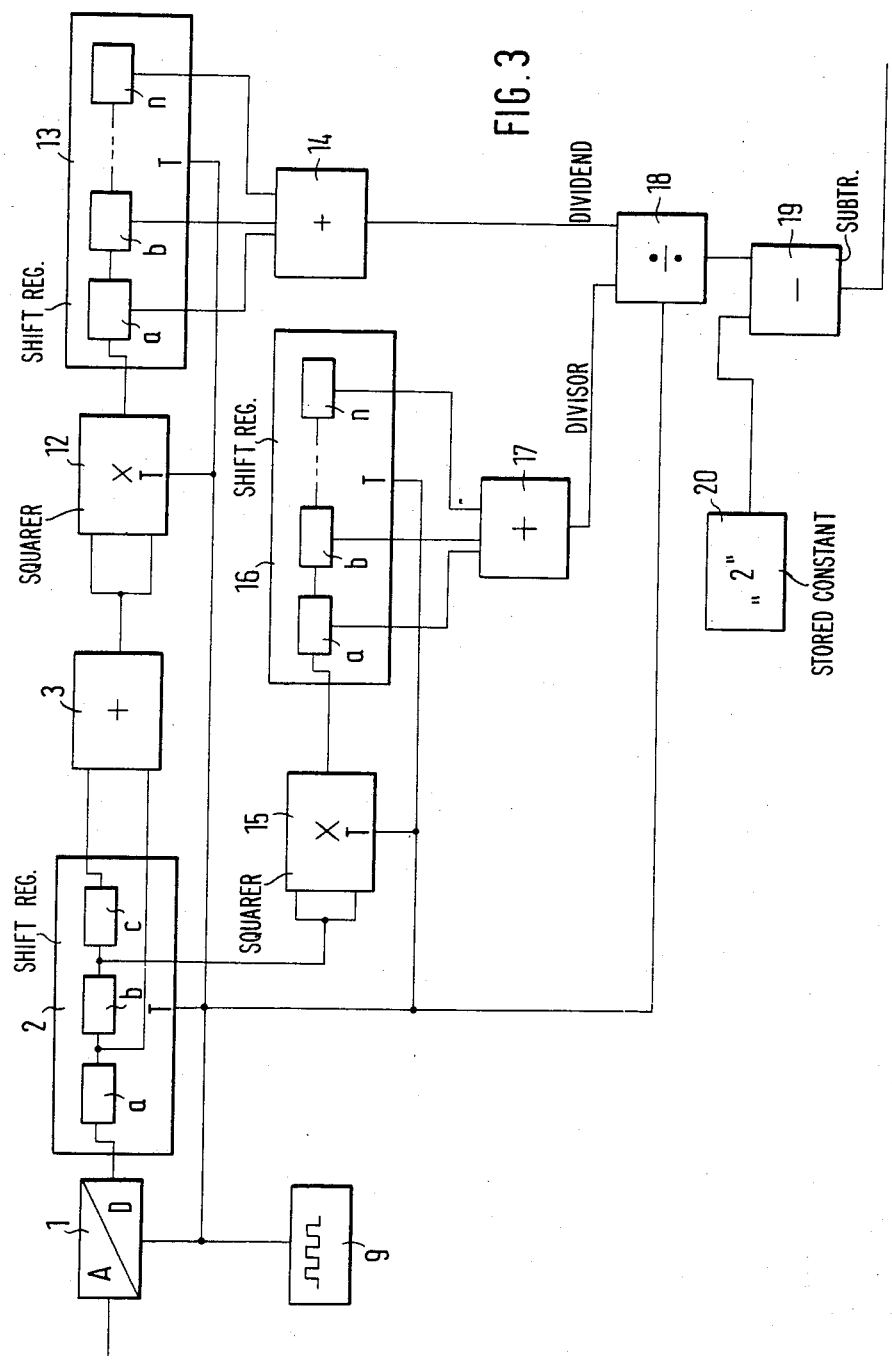

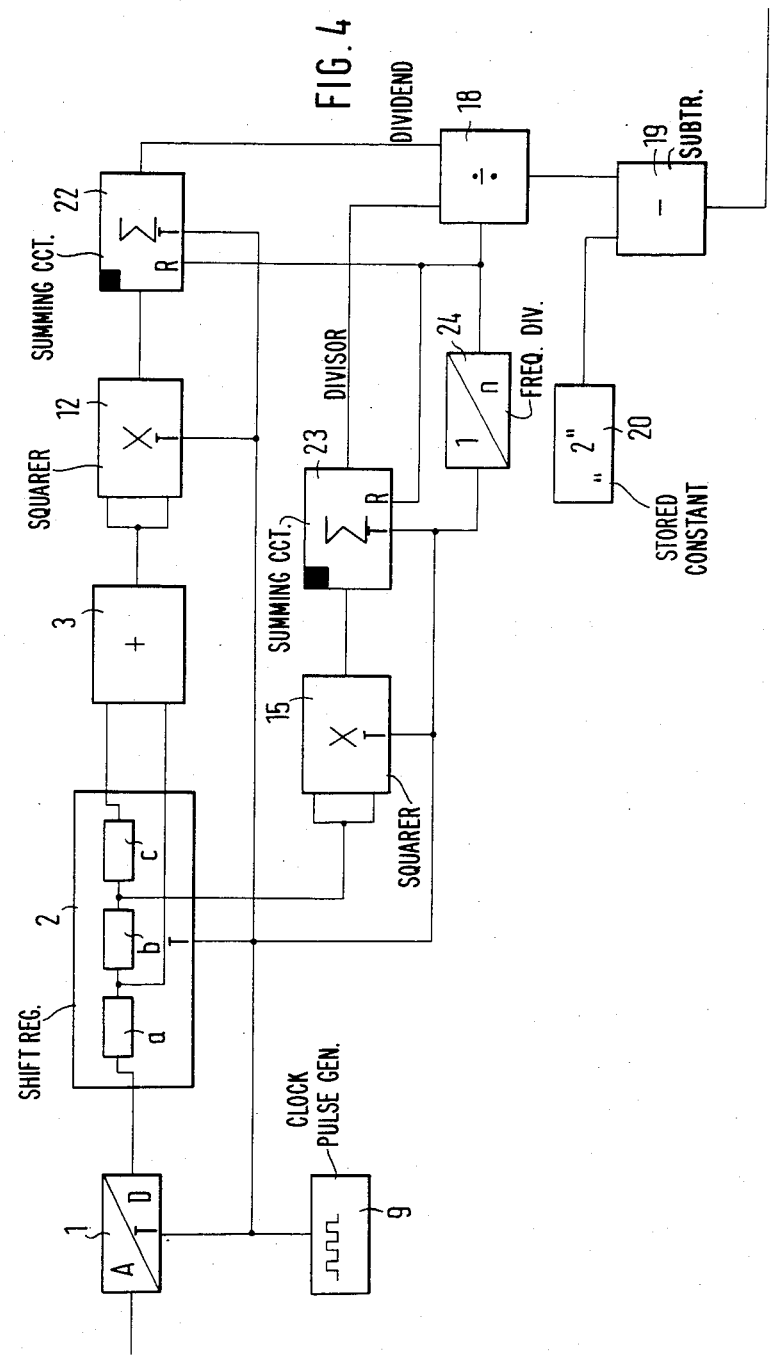

DIGITAL FM DEMODULATOR

This invention concerns a demodulator for frequency modulated signals of digital form for demodulating the frequency modulation in a direct digital manner.

German published Patent Application DE-OS No. 30 07 907 describes a digital receiver that processes received signals digitally. The disclosure particularly shows a digital mixer and digital intermediate frequency filter which is followed by a digital demodulator. The details of the constitution of that demodulator cannot be ascertained from that published application, however.

THE INVENTION

It is an object of the present invention to demodulate digitally encoded frequency mmodulation signals by digital signal processing in a simple way that is uninfluenced by possible amplitude variations of the FM signal.

Briefly, three data words that are successive in time are put into a shift register having three places, the first and last words in time sequence are added and their sum is divided by the middle word. Summing of successive quotient results provides the demodulated signal. Such summing may be done in a second shift register. A threshold switch prevents an impermissionable division by a zero value. A digital FM demodulator of the invention provides simple processing that is not sensitive to possible amplitude fluctuations of the FM signal. This demodulator also requires merely a few commercially available computing and storage components, so that it is simple to construct. Its parameters are easily fitted to any particular task.

Supplying the quotient signals to a further storage device, such as a shift register, and adding individual signals of the store cells together makes it possible to keep very small the quantization noise of the output signal. An equivalent procedure is to supply the quotient signal to a summing circuit. Summing circuits are less expensive than storage units, but they require a higher sampling frequency for the overall system, or the passing of the signal through a digital low pass filter.

In a further development of the invention it is found advantageous to square the dividend and the divisor before the division step, and then use squared quantities to form the quotients. By the squaring of the result, the occurrence of difficulties in quotient formation is substantially reduced. It is particularly advantageous in this regard to supply the squared signals to another storage unit. Since the quotient formation follows the summation of the storage unit contents, it is assured that the quotient cannot become zero if at least two or more storage places are provided. By means of storage, moreover a reduction of the quantization noise is obtained. At increased sampling rates it is advantageous to replace the storage unit by summing components which are more quickly and less expensively producible. In order to take account of d.c. components arising in this process, it is advantageous to subtract a constant magnitude from the signal applied to the divider.

It is also advantageous to provide a threshold switch that checks the divisor provided to the divider for whether or not it is zero. In such a case it is better to ignore the result of the divider and not to introduce the resulting value into the storage unit. By division by zero or values in the neighborhood of zero the output signal would be transiently falsified, which would lead to a disturbance of the data transmission. Disturbances of the transmission system becomes smaller, however, the larger the number of storage stages that are provided in the following storage unit or the higher the sampling frequency is chosen to be. It has been found particularly advantageous if between the sampling period T and the carrier frequency f of the FM signal the following relation is established for the system to be squared:

$$f \cdot t = \tfrac{1}{4} \cdot (2n+1)$$

for $n = 0, 1, 2 \ldots$.

or else $f \cdot t = \tfrac{5}{8} \cdot (2n+1)$

The stores are advantageously constituted as shift registers. Shift registers are relatively cheaply obtainable and permit a high clock frequency. The number of storage cells or the number of summing steps of the summing device is selected in a manner dependent on the maximum permissible signal to noise ratio, the bit count of the data words, the low-frequency band width and the sampling frequency. In that manner an optimum signal transmission can be obtained.

THE DRAWING

The invention is further described by way of four illustrative examples with reference to the annexed drawings, in which:

FIG. 1 is a block circuit diagram of a demodulator having a divider and two shift registers;

FIG. 2 is a portion of the demodulator according to FIG. 1 together with a summing unit;

FIG. 3 is a further embodiment of a demodulator with squaring; and

FIG. 4 is a block circuit diagram of a demodulator according to FIG. 3 with summing provided.

DESCRIPTION OF THE ILLUSTRATED EMBODIMENTS

The manner of operation of the digital demodulator in a radio receiver for VHF broadcrast reception needs first to be explained before the circuits are discussed. Known broadcast receivers are designed and constructed according to the so called superposition principle. In these the received broadcast signal is supplied to a mixer which is also supplied with an oscillator signal that has a frequency that can be changed. The broadcast signal is transformed in the mixer to a fixed intermediate frequency range which today is generally designed to accept a carrier frequency of 10.7 MHz. This signal is thereafter demodulated.

As is known from DE-OS No. 30 07 907, it is in certain circumstances advantageous for the signal processing to be performed digitally. According to the particular state of practical development and the frequency to be received, it is desirable to provide the analog to digital conversion either right away in the input stage, as this is described in the published German patent application just cited, or to carry out the conversion at a later stage, for example in the intermediate frequency region. Especially in the reception of broadcasts in the higher frequency portions of the spectrum, there are good reasons for having the digital signal processing begun only after the signal is brought down into the intermediate frequency band. In the intermediate frequency range digital signal processing can be mastered in the present state of the art, since the highest frequency to be processed determines the sampling rate of the digital system.

FIG. 1 represents a digital demodulator that is designed for processing of digital intermediate frequency signals. For better understanding of the circuit an analog to digital converter 1 is shown preceeding the demodulator. A shift register 2 which has three storage cells, a, b and c, follows the analog to digital converter 1 after such signal preparation by digital filtering (not shown in the diagram) as may be necessary or desirable in accordance with the usual practice. The output signal of the storage cell a and the output signal of the storage cell c are respectively supplied to the two inputs of an adder 3. The output of the adder 3 is supplied to the dividend input of the divider 4. The divisor input of the divider 4 is connected to the output of the storage cell b of the shift register 2. The output of the divider 4 is supplied to a further shift register 7 that has n storage cells. The output signal of each storage cell a, b, c, . . . n of the shift register 7 is connected to one of the inputs of the second adder 8. The demodulated digital signal is available at the output of the adder 8.

A pulse generator 9 provides the pulses for clocking the units of the system that needs synchronization with the sampling rate. The clock signal of the pulse generator 9 is supplied to the clock input of the analog to digital converter 1, of the shift register 2 and of the divider 4. The clock pulses are also supplied to one input of an AND gate 6. The content of the middle storage cell b of the shift register 2 is also supplied to a threshold switch 5, the output of which is supplied to another input of the AND gate 6. The output to the AND gate 6 is supplied to the clock input of the shift register 7.

The analog intermediate frequency signal is converted, sample by sample, into digital words by the analog-to-digital converter 1. The bit count of the digital word is to be 10 selected according to the desired precision. The applied analog signal is measured in the analog-to-digital converter at instants equidistant of time, for example four times per period of the carrier frequency, and converted into a digital word. The maximum frequency of the applied signal accordingly determines the sampling frequency of the analog-to-digital converter which then becomes the digital word rate in further signal processing. On the basis of the intermediate frequency of 10.7 MHz selected for the example, there accordingly results, with four samplings per cycle of carrier signal frequency, a sampling frequency of 42.8 MHz. The digital word is now shifted into the shift register 2 at each clock pulse. This digital word is discarded at the end of the shift register 2. The respective contents of the first and third shift register cells are added in the adder 3. This added signal is supplied to the divider 4 and there divided by the value that is present in the second shift register cell. By sampling the frequency modulated signals at instants equidistant in time it can now happen that the sampling occurs exactly at the moment of a null transition. In this case, an impermissible division of zero by zero could occur. This division by zero can falsify the output signal.

The falsification just described is the less, the higher the sampling rate or the wider the scope of the dividend averaging is, but it is nevertheless better to avoid such a division entirely. For this purpose the threshold switch 5 is provided. The signal in the second storage cell 2b is continuously checked with respect to its value in the threshold switch 5. If this signal is found in the neighborhood of zero, the transfer of the output of the signal provided by the divider 4 into the shift register 7 is prevented by the AND gate 6. The limits perscribed by the threshold switch 5 are essentially determined by the precision and capacity of the quotient calculating circuit of the divider 4.

For simple applications the output signal of the divider output signal is directly utilizable. It is more advantageous, however, to provide the shift register 7 and to shift the results of the divider operation into the storage cells of the shift register 7. By averaging of the values put into the storage cells a, b, c, . . . n of the shift register 7 the result can be improved. In particular the signal to noise ratio can be improved in this manner. The S/N ratio becomes the better, the greater the number of previous values are stored in the shift register 7. An upper limit to the number of previous values is given by the maximum frequency of the useful signal and the frequency deviation. If averaging is done over too high a number of past values, the result is thereby falsified. With a sampling frequency of 42 MHz and a maximum useful frequency signal of 60 kHz, for example, it has been found sufficient to provide eight storage cells for the shift register 7. The useful signal is made available at the output of the adder 8. This signal can, for example, be stored digitally in a digital recorder or, after a digital-to-analog conversion, be supplied to an ordinary analog amplifier. The digital demodulation process makes it possible to build an FM demodulator without the lining up of ratio detectors, symmetry potentiometers or other necessary adjustments. The quality of the FM demodulator is essentially determined by the clock pulse generator 9, the accuracy of the analog-to-digital converter, the adder and divider and the length of the shift register 7. The demodulator is thus compatible with, and adaptable to, various operating conditions in a simple fashion and is suited also for demodulation of remote control signals, television signals or other carrier frequency signals. Since only digital circuit components are used in it, the digital demodulator can be consolidated into an integrated circuit. Capacitances or coils are not necessary.

FIG. 2 shows a modification of the circuit of FIG. 1. The signal from the divider 4 in this case goes to a summing circuit 10. The latter has a clock input to which the signal from the output of the AND gate 6 is applied. The output of the AND gate 6 is also connected to a frequency divider 24. The output of the frequency divider 24 is supplied on the one hand to the reset input of the summing circuit 10 and, on the other hand, to a switch 11.

By this circuit it is also possible to obtain an acceptable signal to noise ratio. The provision of samples continuously at essentially the original sampling rate, as in the case of the shift register 7 is not possible in this case, however, but the samples are supplied somewhat more intermittently.

Every output value of the divider 4 is summed in the summing circuit 10. The AND gate 6 prevents the transfer to the adder of an erroneous value which could arise by a division by zero. After a sequence of, for example, five samples, the switch 11 is closed and the demodulated digital value is available at the output of the switch 11. At the same time the contents of the summing circuit 10 are set back to zero. The sample sequence summed is determined essentially by the division ratio of the frequency divider 24. This divider can be made programmable, so that its divisor can be changed for adapting the circuit to various different requirements, by using a stored value setting the divisor. Such a stored value may, for example, be preserved in a ROM. The summing circuit has the advantage that it is cheaper to make and makes possible the use of a faster sampling rate. If the same quality as is available from the circuit of FIG. 1 is to be maintained with the more intermitent output samples of the circuit of FIG. 2, a higher sampling frequency should be chosen.

Instead of the example of FIG. 1 or that of FIG. 2 it is also possible to provide a digital low pass circuit instead of the shift register 7 or the summing circuit 10, the low pass circuit being designed to pass only the low frequency signal (for example an audio frequency signal). Such digital low pass circuits are described, for example, by Tietze and Schenk, Halbleiterschaltungstechnik, 5th edition, page 606. If in such a case a signal is applied to the input that has been divided by zero in the divider 4, this will be recognized by means of the AND gates 6. In this case the last previous value will be read in once again into the digital filter and the current erroneous value suppressed.

FIG. 3 shows another demodulator which has a squarer circuit. The analog-to-digital converter 1, provided for converting an IF signal into a digital signal is shown here only by way of example. Usually a digital preamplifier or a digital IF amplifier will be provided at the input of the demodulator.

The output of the digital converter is supplied in this example to a shift register 2 that has three storage cells. An adder 3 is connected to the shift register 2 and adds together the contents of the storage cell a and the storage cell c of the shift register 2. The output of the adder 3 is supplied to a squarer 12. In the drawing the squarer is shown as a multiplier to which the same signal is supplied to both of its inputs. Another shift register 13 which follows the squarer 12 has up to n storage cells. The outputs of the storage cells of the shift register 13 are supplied to an adder 14. The output of the adder 14 goes to one input of the divider 18.

The content of the storage cell b of the shift register 2 is supplied to a second squarer 15, which is likewise a multiplier, to both inputs of which the same signal is supplied. The output of the squarer 15 goes to a shift register 16 that has n storage cells. The respective signals of all the storage cells are added together in an adder 17. The output signal of the adder 17 is supplied to another input of the divider 18.

The output of the divider 18 is supplied to a subtractor 19 in which a constant factor, preferably the factor two is subtracted. The number two can be stored in a constant value store 20. At the output of the subtractor 19 is available a digital signal which corresponds to the demodulated FM signal.

A clock pulse generator 9 determines the sampling frequency. The clock signal is supplied to the analog-to-digital converter 1, the shift registers 2, 13 and 16, the multipliers 12 and 15 and to the divider 18.

The analog intermediate frequency signal is converted into a digital word in the analog-to-digital converter 1. The sampling frequency is again determined by the frequency of the clock pulse generator 9. The choice of the frequency is made according to the criteria previous described. The digital words are read into the shift register 2. The shift register 2 has three cells, so that next to the current value the two preceding past values are stored. In the adder 3 the current value and the second previous value are added together. This sum is squared in the squarer 12 and read into the shift register 13. Up to n past values of the squared sum are storable in the cells of the shift register 13. The average value of the cell contents is formed by the adder 14.

The value in the cell b of the shift register 2 is squared in the squarer 15 and likewise read into a shift register 16 that has n storage cells. The contents of these n cells are summed in the adder 17. For the dimensioning of the shift registers 13 and 16 the same principles already mentioned hold. With increasing number of shift register cells the signal to noise ratio improves. The S/N ratio, however, is also dependent upon the bit count of the digital words and on the sampling frequency. The maximum number of places in the shift registers 13 and 16 is therefore limited by the maximum frequency of the useful signal and the frequency deviation of the FM signal. For the processing time it is to be assumed that the summation must take place over a period of time over which the useful signal can be regarded as constant to a first approximation. The squaring by the squarers 12 and 15 has the effect that negative digital values cannot appear. Since the analog signal fluctuates about a zero level, it is necessary to expect negative and positive signals in the shift register too, according to the sampling moment. This condition (sign) is recognized by the value of one bit of the digital word. Since in connection with the squarers 12 and 15 only positive signals can appear, only signals larger than zero will be present at the outputs of the adders 14 and 17 so long as the shift registers 13 and 16 have at least two storage cells. On the basis of the selected sampling frequency at least one of these two values must be other than zero. This fact is essentially of interest for the output of the summing circuit 17, since it provides a divisor for the dividing circuit 18. In the embodiment of which the circuits are illustrated in FIG. 3 the problems of the quotient formation do not appear.

In order avoid problems in quotient formation it is sufficient if the shift registers 13 and 16 have at least two storage cells. The shift registers 13 and 16 are not absolutely necessary. In the case of higher sampling frequency the output signal of the squarers 12 and 15 can be supplied directly to the divider 18. In this case, however, the same problems appear in quotient formation as was already the case in the circuit of FIG. 1. It will be useful then to provide a threshold switch that checks whether the divisor is in the neighborhood of zero. The bit count of the data words and the accuracy of the quotient computing circuit of the divider 18 again determine the criteria of the threshold switch. The output of the divider 18 contains a digital word that, because of the previous squaring is shifted by a constant value. The correction is made by the subtraction of a constant value. The dc components can be fully eliminated by the subtraction of the value two. If these dc components do not interfere, the subtraction in the subtractor 19 can be omitted.

A circuit for discontinuous operation is shown in FIG. 4. In this case the shift registers 13 and 14 are replaced by summing circuits 22 and 23 respectively. The analog signal is converted by the analog-to-digital converter 1 into a digital signal which is supplied to the shift register 2. The latter has three storage cells a, b and c, in which the digital signals are continually introduced at every clock pulse. The content of the cells a and c are added together in the adder 3. The output signal of the adder 3 is supplied to the multiplier 12 which is connected as a squarer. The output signal of the multiplier 12 is furnished to a summing circuit 22, the output of which is connected to one input of the divider 18. The word in the storage cell c of the shift register 2 is squared in the multiplier 15 which furnishes it output to a summing circuit 23. The output of the latter is connected to another input of the divider 18.

The output of the divider 18 is supplied to a subtractor 19 in which a constant number, preferably 2, is subtracted. The demodulated digital signal is then available at the output of the subtractor 19.

The clock pulse generator 9 supplies the sampling signal to the analog-to-digital converter 1, the shift register 2, the squarers 12 and 15 and the summing circuits 22 and 23. A frequency divider 24 is also connected to the pulse generator 9 to provide an output signal to the divider 18 and to the reset inputs of the summing circuits 22 and 23 respectively. The summing circuits 22 and 23 each require only a storage unit in which the output signals of the respective squarers 12 and 15 are added up for, for example, four clock periods. The divider 24 must then divide the clock frequency by four. After the fourth clock pulse the quotient formed from the respective output signals of the summing circuits 22 and 23 is formed in the divider. At the same time the summing circuits 22 and 23 are reset, so that a new addition can proceed. The subtractor 19 is provided for elimination of dc components.

This circuit likewise has the advantage that quotient formation is not problem, because the signals at the outputs of the summing circuits 22 and 23 are always greater than zero if the summing circuit 23 adds over at least two clock cycles. A further advantage of this circuit is that only low requirements are put on the divider 18. Since the quotient of the stored contents of the summing circuits 22 and 23 are not formed at every clock pulse, but only after a prescribed sequence of clock pulses, the time-consuming division operation can run substantially more slowly than, for example, the less time-consuming storage operations. For the divider itself, therefore, simple circuit forms can be used.

Even the use of shift registers is not absolutely necessary. For example all shift registers could be replaced by one RAM component which is specifically operated by a control unit. Furthermore, the circuit configurations of FIGS. 3 and 4 are each readily capable of being made as integrated circuits. By variation of the sampling frequency, the number of storage cells or the number of summing steps, there is made possible a wide ranging adaptability of the demodulator to particular applications.

It is convenient to constitute the divider 4 of FIG. 1 and the dividers 18 of FIGS. 3 and 4 as multipliers which include a circuit for forming the nines complement of the divisor and multiply the said nines complement by the dividend in order to obtain the quotient.

I claim:

1. Demodulator for directly demodulating the frequency modulation of frequency modulated (FM) signals converted into a succession of digitally coded samples, comprising:
   first storage means for storing at least three successive recent digitally coded samples of said FM signals;
   means for adding two of said stored samples, one of which is more recent and the other of which is less recent than a third sample;
   means for dividing the output of said adding means by the value of said third sample and thereby producing a quotient signal such that a succession of quotient signals is representative of a desired demodulated FM signal:
   second storage means for storing a predetermined number of said quotient signals which are produced in succession by said divider, and
   second adding means connected to said additional storage means for adding together the quotient signal in said storage means and thereby providing an output which is representative of a moving average of said quotient signals.

2. Demodulator according to claim 2 in which said digital demodulator is preceded by an analog-to-digital converter for conversion of analog FM signals having a predetermined carrier frequency into a succession of digitally coded samples and in which sampling frequency of said analog-to-digital converter is at least three times as high as said predetermined carrier frequency.

3. Demodulator according to claim 2 in which said storage means are constituted in shift register form.

4. Demodulator according to claim 2 in which said storage means and said additional storage means are in each case constituted in shift register form.

5. Demodulator according to claim 2 in which said dividing means is constituted as a multiplier arranged to multiply the dividend by the nines complement of the divisor.

6. Demodulator for directly demodulating the frequency modulation of frequency modulated (FM) signals converted into a succession of digitally coded samples, comprising:
   storage means for storing at least three successive recent digitally coded samples of said FM signals;
   means for adding two of said stored samples, one of which is more recent and the other of which is less recent than a third sample;
   means for dividing the output of said adding means by the value of said third sample and thereby producing a quotient signal such that a succession of quotient signals is representative of a desired demodulated FM signal, and
   a summing circuit connected to the output of said divider for successive summing of a predetermined number of quotient signals of a said succession of quotient signals and thereby providing a succession of quotient sum signals independent of each other.

7. Demodulator for directly demodulating the frequency modulation of FM signals converted into a succession of digitally coded samples, comprising:
   means for storing at least three successive digitally encoded recent samples of said FM signals;
   means for adding together two samples stored in said storage means, one of which is more recent and the other of which is less recent than a third sample, in order to provide a first sum signal;
   first squaring means for squaring said first sum signal;
   second squaring means for squaring said third sample stored in said storage means;
   means for dividing the output of said first squaring means by the output of said second squaring means and thereby producing a succession of quotient signals representative of the desired demodulation.

8. Demodulator according to claim 7 in which first additional storage means are interposed between said first squaring means and said dividing means and second additional storage means are interposed between said second squaring means and said dividing means, said first and second additional storage means serving to add together the same predetermined number of successive values provided at the respective outputs of said first and second squaring means and producing successions of sum signals and furnishing the same to said dividing means.

9. Demodulator according to claim 7 in which first and second summing circuits (14, 17, 22, 26) are respectively interposed between said first and second squaring means (12, 15) and said dividing means (18) and serve to add together a predetermined number of successive output values of the respective squaring means and to provide successive sum signals of progressively different sets of said output values to said dividing means.

10. Demodulator according to claim 7 in which means are provided at the output of said dividing means for subtracting a constant value from the quotient values provided in succession by said dividing means.

11. Demodulator according to claim 8 in which means are provided at the output of said dividing means for subtracting a constant value from the quotient values provided in succession by said dividing means.

12. Demodulator according to claim 9 in which means are provided at the output of said dividing means for subtracting a constant value from the quotient values provided in succession by said dividing means.

13. Demodulator according to claim 7 in which a threshold switch is provided for comparing said third sample of said storage means with a predetermined value and suppressing the transfer of a quotient signal from said divider when said third sample value is less than said predetermined value.

14. Demodulator according to claim 7 in which said digital demodulator is preceeded by an analog-to-digital converter for conversion of analog FM signals having a predetermined carrier for frequency into a succession of digitally coded samples and in which the sampling frequency of said analog-to-digital converter is at least three times as high as said predetermined carrier frequency.

15. Demodulator according to claim 7 in which said storage means are constituted in shift register form.

16. Demodulator according to claim 8 in which said storage means and said additional storage means are in each case constituted in shift register form.

17. Demodulator according to claim 7 in which said dividing means is constituted as a multiplier arranged to multiply the dividend by the nines complement of the divisor.

18. Demodulator for directly demodulating the frequency modulation of frequency modulated (FM) signals converted into a succession of digitally coded samples, comprising:

storage means for storing at least three successive recent digitally coded samples of said FM signals;

means for adding two of said stored samples, one of which is more recent and the other of which is less recent than a third sample;

means for dividing the output of said adding means by the value of said third sample and thereby producing a quotient signal such that a succession of quotient signals is representative of a desired demodulated FM signal, and a threshold switch for comparing said third sample of said storage means with a predetermined value and suppressing the transfer of a quotient signal from said divider when said third sample value is less than said predetermined value.

* * * * *